(12) United States Patent
Li et al.

(10) Patent No.: US 8,988,951 B2
(45) Date of Patent: Mar. 24, 2015

(54) METHOD AND DEVICE FOR WRITING BLOCK DATA TO AN EMBEDDED DRAM FREE OF ADDRESS CONFLICTS

(75) Inventors: Xian Li, Chengdu (CN); Hongbo Shi, Shenzhen (CN); Yalin Bao, Chengdu (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 221 days.

(21) Appl. No.: 13/331,817

(22) Filed: Dec. 20, 2011

(65) Prior Publication Data

US 2012/0206981 A1 Aug. 16, 2012

(30) Foreign Application Priority Data

Feb. 12, 2011 (CN) .......................... 2011 1 0036954

(51) Int. Cl.
*G11C 7/22* (2006.01)
*G06F 12/06* (2006.01)
*G11C 11/4076* (2006.01)
*G11C 11/408* (2006.01)

(52) U.S. Cl.
CPC ............ *G06F 12/06* (2013.01); *G11C 11/4076* (2013.01); *G11C 11/408* (2013.01); *G06F 2212/2532* (2013.01)
USPC ............ 365/189.16; 365/189.14; 365/189.04; 365/230.03

(58) Field of Classification Search
USPC ............... 365/230.03, 230.04, 238.5, 189.04, 365/189.14, 189.15, 189.16
See application file for complete search history.

(56) References Cited

U.S. PATENT DOCUMENTS 7,242,610 B2 * 7/2007 Kumagai ................. 365/185.01
2011/0022791 A1   1/2011 Iyer et al.

OTHER PUBLICATIONS

Office Action issued in corresponding Chinese Patent Application No. 201110036954.4, mailed Jul. 18, 2012.
Office Action issued in corresponding Chinese Patent Application No. 201110036954.4, mailed Oct. 26, 2011.
Office Action issued in corresponding Chinese Patent Application No. 201110036954.4, mailed Feb. 16, 2013.

* cited by examiner

*Primary Examiner* — Andrew Q Tran
(74) *Attorney, Agent, or Firm* — Brinks Gilson & Lione

(57) ABSTRACT

Embodiments of the present invention provide a method and a device for writing data. The method includes: receiving a data block that is to be written in an EDRAM; obtaining, according to a status of a bank in the EDRAM, usable addresses corresponding to usable banks in the EDRAM; selecting an address from the usable addresses as a write-in address of the data block; and writing the data block in a bank corresponding to the write-in address. In the embodiments of the present invention, problems in the prior art that a conflict occurs when a data block is written in a bank and a conflict occurs when a data block is read from a bank can be avoided, and working efficiency of the EDRAM is improved.

5 Claims, 2 Drawing Sheets

METHOD AND DEVICE FOR WRITING BLOCK DATA TO AN EMBEDDED DRAM FREE OF ADDRESS CONFLICTS

CROSS-REFERENCE TO RELATED APPLICATIONS

This application claims priority to Chinese Patent Application No. 201110036954.4, filed on Feb. 12, 2011, which is hereby incorporated by reference in its entirety.

FIELD OF THE INVENTION

The embodiments of the present invention relate to data processing technologies, and in particular, to a method and a device for writing data.

BACKGROUND OF THE INVENTION

Packet buffer is one of dispensable key technologies in a modern communication device A main function of the packet buffer is to provide buffer for a data block. An Embedded Random Access Memory (Embedded Random Access Memory, referred to as EDRAM) is used to buffer a data packet, and an the EDRAM may be internally divided into a plurality of banks (Banks), which are configured to store a data block and a corresponding write-in address. Generally speaking, writing a data block in a bank needs one or more clock periods. When a data block is being written in a bank, another data block cannot be written in or read from the bank; and another data block can not be written in or read from the bank till the data block is successfully written in the bank. Similarly, reading a data block from a bank needs one or more clock periods (the clock period is in consistent with a clock period of writing a data block in a bank). When reading a data block from a bank, another data block cannot be read from or write in the bank; and another data block can not be read from or written in the bank till the data block is successfully read from the bank.

In the prior art, after a write-in request including a data block is received, a write-in address is selected at random, and then the data block is written in a bank corresponding to the selected write-in address. Selection of the write-in address is random, therefore, write-in addresses that are continuously selected may correspond to the same bank; or a bank corresponding to a selected write-in address that is currently reading another data block. Under this circumstance, a conflict may occur when a data block is written in a bank; or a conflict may occur when a data block is read from a bank, which results in the data blocks being unable to be written continuously, or data blocks being unable to be continuously read in a packet manner, so that working efficiency of the EDRAM is reduced.

SUMMARY OF THE INVENTION

Embodiments of the present invention provide a method and a device for writing data, so as to avoid problems in the prior art regarding the occurrence of a conflict when a data block is written in a bank and the occurrence of a conflict occurs when a data block is read from a bank.

A method for writing data provided in an embodiment of the present invention includes:
  receiving a data block that is to be written in an EDRAM;
  obtaining, according to a status of a bank in the EDRAM, usable addresses corresponding to usable banks in the EDRAM;
  selecting an address from the usable addresses as a write-in address of the data block; and
  writing the data block in a bank corresponding to the write-in address.

A device for writing data further provided in an embodiment of the present invention includes:
  a data receiving module, configured to receive a data block that is to be written in an EDRAM;
  an address obtaining module, configured to obtain, according to a status of a bank in the EDRAM, usable addresses corresponding to usable banks in the EDRAM;
  an address selection module, configured to select an address from the usable addresses as a write-in address of the data block; and
  a data write-in module, configured to write the data block in a bank that is corresponding to the write-in address.

In the embodiments of the present invention, a data block to be written in an EDRAM is received, according to a status of a bank in the EDRAM, usable addresses corresponding to usable banks in the EDRAM are obtained, and an address is selected from the usable addresses as a write-in address of the data block, so that the data block can be written in a bank corresponding to the selected write-in address. The bank corresponding to the selected write-in address is a usable bank, therefore, data blocks can be written continuously, and can be continuously read in a form of a data packet, so that the problems in the prior art that a conflict occurs when a data block is written in a bank and a conflict occurs when a data block is read from a bank can be avoided, and work efficiency of the EDRAM is improved.

BRIEF DESCRIPTION OF THE DRAWINGS

To describe the technical solutions in the embodiments of the present invention or in the prior art more clearly, the accompanying drawings required for describing the embodiments or the prior art are introduced briefly in the following. A The accompanying drawings in the following description are only some embodiments of the present invention, and persons of ordinary skill in the art may also derive other drawings from these accompanying drawings.

DETAILED DESCRIPTION OF THE EMBODIMENTS

In order to make the objectives, technical solutions, and advantages of embodiments of the present invention clearer, the technical solutions in the embodiments of the present invention are clearly and completely described in the following with reference to the accompanying drawings in the embodiments of the present invention. The embodiments in the following description are merely a part rather than all of the embodiments of the present invention. Based on the embodiments of the present invention, all other embodiments obtained by persons of ordinary skill in the art without creative efforts shall fall within the protection scope of the present invention.

Figure 1:
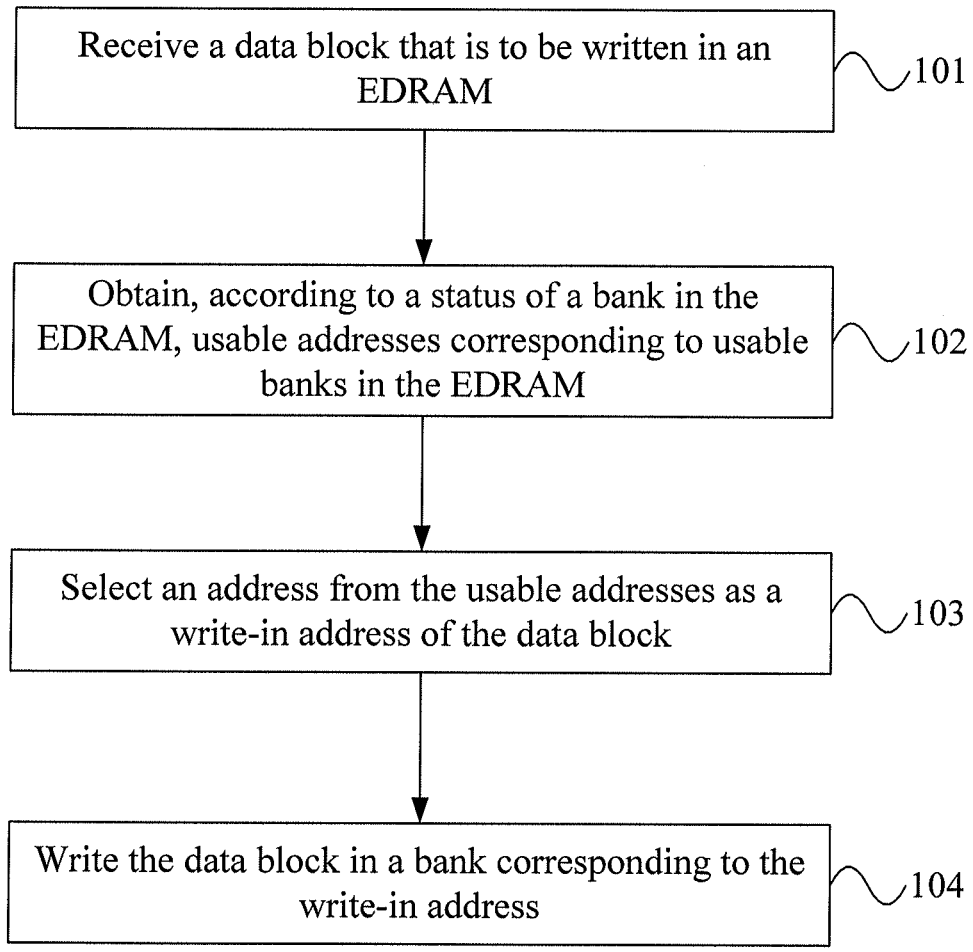
FIG. 1 is a schematic flow chart of a method for writing data according to a first embodiment of the present invention.

FIG. 1 is a schematic flow chart of a method for writing data according to a first embodiment of the present invention. As shown in FIG. 1, the method for writing data in this embodiment may include the following steps:

Step 101: Receive a data block that is to be written in an EDRAM.

Step 102: Obtain, according to a status of a bank in the EDRAM, usable addresses corresponding to usable banks in the EDRAM.

Specifically, in this step, if data is not being written in nor read from a bank in the EDRAM, determine that the bank is a usable bank; and then obtain a usable address corresponding to the usable bank, so that working efficiency of the EDRAM can be improved.

Optionally, in this step, according to the number of stored data blocks in the usable banks, a bank where the number of stored data blocks is the smallest may be selected from the usable banks as a write-in bank of the data block; and a usable address corresponding to the write-in bank is obtained. In this way, it can be ensured that data blocks in each bank are even, so that a load balance of the EDRAM is achieved, and the work efficiency of the EDRAM is further improved. Specifically, a counter may be used to record the number of data blocks that are stored in each bank. If one data block is written in a bank, a 1 is added to a value of a counter corresponding to the bank. If one data block is read from a bank, a 1 is deducted from a value of a counter corresponding to the bank.

Step 103: Select an address from the usable addresses as a write-in address of the data block.

Step 104: Write the data block in a bank corresponding to the write-in address.

In this embodiment of the present invention, a data block to be written in an EDRAM is received, according to a status of a bank in the EDRAM, usable addresses corresponding to usable banks in the EDRAM are obtained, and an address is selected from the usable addresses as a write-in address of the data block, so that the data block can be written in a bank corresponding to the selected write-in address. The bank corresponding to the selected write-in address is a usable bank, therefore, data blocks can be written continuously, and can be continuously read in a form of a data packet, so that problems in the prior art that a conflict occurs when a data block is written in a bank and a conflict occurs when a data block is read from a bank can be avoided, and the work efficiency of the EDRAM is improved.

It may be understood by persons skilled in the art that in this embodiment, a write-in address in an address pool is actually divided into several address segments, where each address segment is respectively corresponding to a bank. When a data block is read from a bank, a write-in address corresponding to the data block is reclaimed. Specifically, the address may be reclaimed according to an address segment to which the write-in address belongs. Write-in addresses corresponding to the same bank are reclaimed to the same address segment, so that the write-in address can be selected and used again.

It should be noted that: the preceding method embodiments are described as a combination of a series of actions for simple description. Persons skilled in the art may be informed that the present invention is not limited by a sequence of the described actions. In the present invention, some steps may be implemented in another sequence or be implemented at the same time. In addition, persons skilled in the art will also understand that, the embodiments described in the specification are all exemplary embodiments, where actions and modules involved are not necessarily essential to the present invention.

In the preceding description, each embodiment is described with a particular emphasis, and for a part that is not described in one embodiment, reference may be made to a relevant description of another embodiment.

Figure 2:
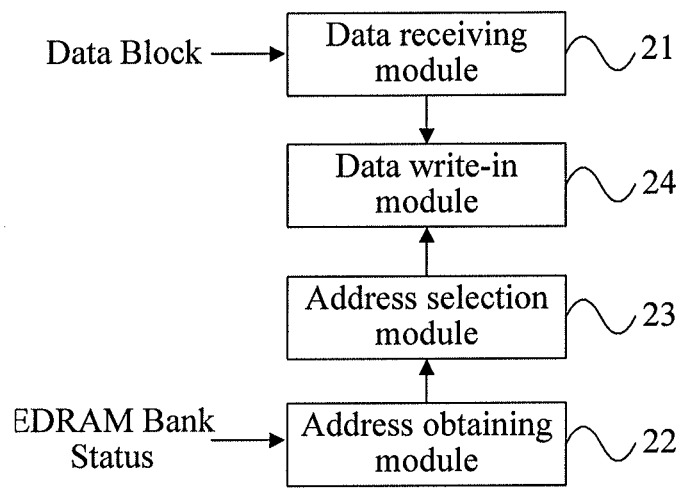
FIG. 2 is a schematic structural diagram of a device for writing data according to a second embodiment of the present invention.

FIG. 2 is a schematic structural diagram of a device for writing data according to a second embodiment of the present invention. As shown in FIG. 2, a device for writing data provided in this embodiment may include a data receiving module 21, an address obtaining module 22, an address selection module 23 and a data write-in module 24. The data receiving module 21 is configured to receive a data block that is to be written in an EDRAM. The address obtaining module 22 is configured to obtain, according to a status of a bank in the EDRAM, usable addresses corresponding to usable banks in the EDRAM. The address selection module 23 is configured to select, from the usable addresses obtained by the address obtaining module 22, an address as a write-in address of the data block. The data write-in module 24 is configured to write the data block in a bank that corresponds to the write-in address selected by the address selection module 23.

The method provided in the first embodiment of the present application may be implemented by the device for writing data provided in this embodiment of the present application.

In this embodiment, after the data receiving module receives a data block that is to be written in an EDRAM, the address obtaining module obtains, according to a status of a bank in the EDRAM, usable addresses corresponding to usable banks in the EDRAM. Then, the address selection module may select, from the usable addresses obtained by the address obtaining module, an address as a write-in address of the data block, so that the data write-in module can write the data block in a bank that corresponds to the write-in address selected by the address selection module. The bank corresponding to the write-in address that is selected by the address selection module is a usable bank, therefore, data blocks can be written continuously, and can be continuously read in a form of a data packet. Thus, the problems in the prior art that a conflict occurs when a data block is written in a bank and a conflict occurs when a data block is read from a bank can be avoided, and work efficiency of the EDRAM is improved.

Figure 3:
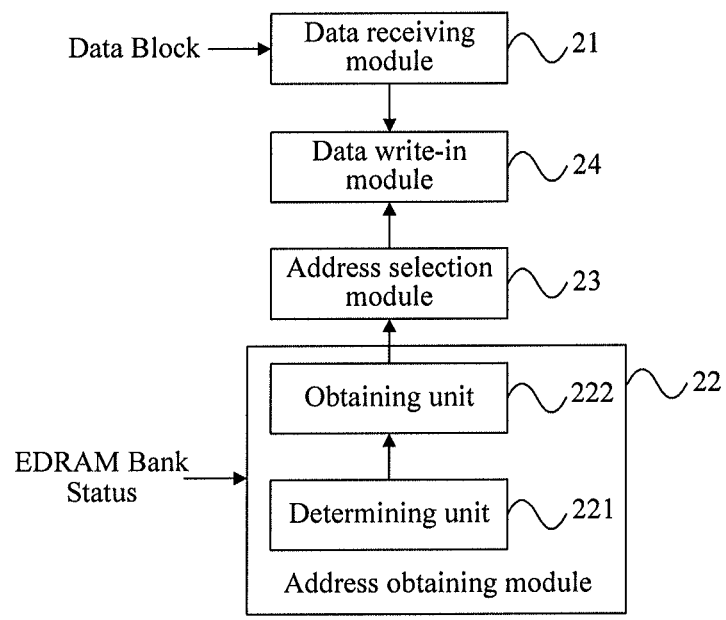
FIG. 3 is another schematic structural diagram of a device for writing data according to the second embodiment of the present invention.

Moreover, as shown in FIG. 3, the address obtaining module 22 in this embodiment of the present application may include a determining unit 221 and an obtaining unit 222. The determining unit 221 is configured to, if data is not being written in nor read from a bank in an EDRAM, determine that the bank is a usable bank. The obtaining unit 222 is configured to obtain a usable address corresponding to the usable bank. Specifically, the obtaining unit 222 may select a bank where the number of stored data blocks is the smallest as a write-in bank of the data block; and then obtain a usable address corresponding to the write-in bank. In this way, it can be ensured that data blocks in each bank are even, so that a load balance of the EDRAM is achieved, and the work efficiency of the EDRAM is further improved.

Persons of ordinary skill in the art may understand that all or a part of the steps of the preceding method embodiments may be implemented by a program instructing relevant hardware. The program may be stored in a computer readable storage medium. When the program runs, the steps of the preceding method embodiments are performed. The storage medium may include any medium that is capable of storing program codes, such as an ROM, an RAM, a magnetic disk, or a compact disk.

Finally, it should be noted that the preceding embodiments are merely used for describing the technical solutions of the present invention, but are not intended to limit the present invention. It should be understood by persons of ordinary skill in the art that although the present invention has been described in detail with reference to the preceding embodiments, modifications may still be made to the technical solution described in each preceding embodiment, or equivalent replacements may be made to some technical features in the technical solutions, however, such modifications or replacements will not make the essence of the corresponding technical solutions depart from the spirit and scope of the technical solutions in the embodiments of the present invention.

What is claimed is:

1. A method for writing data, comprising:

receiving a data block that is to be written in an EDRAM;

obtaining, according to a status of a bank in the EDRAM, usable addresses corresponding to usable banks in the EDRAM;

wherein a bank is determined to be a usable bank if data is not being written in nor read from the bank in the EDRAM;

selecting a bank where the number of stored data blocks is the smallest as a write-in bank of the data block;

obtaining usable addresses corresponding to the write-in bank;

selecting an address from the usable addresses as a write-in address of the data block; and writing the data block in a bank corresponding to the write-in address.

2. The method for writing data according to claim 1, wherein the selecting a bank where the number of stored data blocks is the smallest comprises:

using a counter to record the number of data blocks that are stored in each bank; and selecting the bank having a lowest value of the counter.

3. A device for writing data, comprising a non-transitory computer readable storage medium having stored therein data representing instructions for implementing:

a data receiving module, configured to receive a data block that is to be written in an EDRAM;

an address obtaining module, configured to obtain, according to a status of a bank in the EDRAM, usable addresses corresponding to usable banks in the EDRAM;

wherein the address obtaining module further comprises:

a determining unit, configured to, if data is not being written in nor read from a bank in the EDRAM, determine that the bank is a usable bank; and an obtaining unit, configured to obtain a usable address corresponding to the usable bank, wherein the obtaining unit is further configured to select a write-in bank from the usable banks that balances the load on the EDRAM, and to obtain usable write-in addresses of the write-in bank;

an address selection module, configured to select an address from the usable write-in addresses as a write-in address of the data block; and a data write-in module, configured to write the data block in a bank that is corresponding to the write-in address.

4. The device for writing data according to claim 3, wherein the selecting a write-in bank from the usable banks that balances the load on the EDRAM comprises:

selecting a bank where the number of stored data blocks is the smallest as a write-in bank of the data block.

5. The device for writing data according to claim 4, wherein the selecting a bank where the number of stored data blocks is the smallest comprises:

using a counter to record the number of data blocks that are stored in each bank; and selecting the bank having a lowest value of the counter.

* * * * *